United States Patent
Gidney

(10) Patent No.: US 11,042,813 B2
(45) Date of Patent: Jun. 22, 2021

(54) QUANTUM CIRCUITS WITH REDUCED T GATE COUNT

(71) Applicant: GOOGLE LLC, Mountain View, CA (US)

(72) Inventor: Craig Gidney, Goleta, CA (US)

(73) Assignee: Google LLC

( * ) Notice: Subject to any disclaimer, the term of this patent is extended or adjusted under 35 U.S.C. 154(b) by 0 days.

(21) Appl. No.: 16/644,657

(22) PCT Filed: Dec. 20, 2017

(86) PCT No.: PCT/US2017/067577
§ 371 (c)(1),
(2) Date: Mar. 5, 2020

(87) PCT Pub. No.: WO2019/050555
PCT Pub. Date: Mar. 14, 2019

(65) Prior Publication Data
US 2021/0035008 A1     Feb. 4, 2021

Related U.S. Application Data

(60) Provisional application No. 62/556,163, filed on Sep. 8, 2017.

(51) Int. Cl.
*H03K 19/195* (2006.01)
*G06N 10/00* (2019.01)
*H03K 19/20* (2006.01)

(52) U.S. Cl.
CPC ........... *G06N 10/00* (2019.01); *H03K 19/195* (2013.01); *H03K 19/20* (2013.01)

(58) Field of Classification Search
CPC .................... G01R 31/318536; H03K 19/0013
See application file for complete search history.

(56) References Cited

U.S. PATENT DOCUMENTS

2014/0118024 A1*  5/2014  Eastin .................... B82Y 10/00
326/7

FOREIGN PATENT DOCUMENTS

WO    WO 2014/066056    5/2014

OTHER PUBLICATIONS

AU Office Action in Australian Appln. No. 2017430470, dated Aug. 24, 2020, 3 pages.
Fowler et al., "Surface codes: Towards practical large-scale quantum computation," Physical Review A (Atomic, Molecular, and Optical Physics), Sep. 2012, 86(3):032324-1-032324-48.
(Continued)

*Primary Examiner* — Kurtis R Bahr
(74) *Attorney, Agent, or Firm* — Fish & Richardson P.C.

(57) ABSTRACT

Methods, systems and apparatus for producing quantum circuits with low T gate counts. In one aspect, a method for performing a temporary logical AND operation on two control qubits includes the actions of obtaining an ancilla qubit in an A-state; computing a logical-AND of the two control qubits and storing the computed logical-AND in the state of the ancilla qubit, comprising replacing the A-state of the ancilla qubit with the logical-AND of the two control qubits; maintaining the ancilla qubit storing the logical-AND of the two controls until a first condition is satisfied; and erasing the ancilla qubit when the first condition is satisfied.

20 Claims, 10 Drawing Sheets

(56) References Cited

OTHER PUBLICATIONS

Gidney, "Halving the cost of quantum addition," https://arxiv.org/abs/1709.06648v1, Sep. 2017, 4 pages.
Hasan, "Low-Cost Realization of Toffoli Gate for the Low-Cost Synthesis of Quantum Ternary Logic Functions," 2008 11th International Conference on Computer and Information Technology, Dec. 2008, 259-263.
Jones, "Low-overhead constructions for the fault-tolerant Toffoli gate," Physical Review A (Atomic, Molecular, and Optical Physics), Feb. 2013, 87(2), 022328-1-022328-4.
Paler et al., "Fault-tolerant, high-level quantum circuits : form, compilation and description," Quantum Science and Technology, Apr. 2017, 18 pages.
PCT International Preliminary Report on Patentability in International Appln. No. PCT/US2017/067577, dated Nov. 25, 2019, 14 pages.
PCT International Search Report and Written Opinion in International Appln. PCT/US2017/067577, dated Jun. 5, 2018, 16 pages.
PCT Written Opinion in International Appln. No. PCT/US2017/067577, dated Aug. 9, 2019, 7 pages.

* cited by examiner

QUANTUM CIRCUITS WITH REDUCED T GATE COUNT

This application is a National Stage Application under 35 U.S.C. § 371 and claims the benefit of International Application No. PCT/US2017/067577, filed Dec. 20, 2017, which claims priority to U.S. Application No. 62/556,163, filed Sep. 8, 2017, the disclosure of which is incorporated herein by reference.

BACKGROUND

A quantum circuit is a model for quantum computation in which a computation is a sequence of quantum logic gates—reversible transformations on an n-qubit register.

SUMMARY

The subject matter of the present specification relates to technologies for producing quantum circuits, such as quantum circuits with low T gate counts.

In general, one innovative aspect of the subject matter described in this specification can be implemented in a method for performing a temporary Toffoli quantum logic gate on two control qubits and a target qubit, the method comprising: obtaining an ancilla qubit in an A-state; computing a logical-AND of the two control qubits and storing the computed logical-AND in the state of the ancilla qubit, comprising replacing the A-state of the ancilla qubit with the logical-AND of the two control qubits; applying a CNOT quantum logic gate between (i) the ancilla qubit storing the logical-AND of the two control qubits, and (ii) the target qubit, the ancilla qubit acting as a control qubit for the CNOT quantum logic gate; providing the ancilla qubit storing the logical-AND of the two control qubits as a resource for one or more additional operations; uncomputing the logical-AND of the two control qubits, comprising recovering the A-state of the ancilla qubit by replacing the state of the ancilla qubit storing the computed logical-AND of the two control qubits with an A-state; and providing the ancilla qubit in the recovered A-state as a resource for one or more additional operations.

The foregoing and other implementations can each optionally include one or more of the following features, alone or in combination. In some implementations providing the ancilla qubit in the A-state as a resource for one or more additional operations comprises providing the ancilla qubit in the A-state to perform a T gate.

In some implementations the method is used to perform a first temporary Toffoli quantum logic gate on two control qubits and a target qubit, wherein providing the ancilla qubit in the recovered A-state as a resource for one or more additional operations comprises providing the ancilla qubit in the recovered A-state to perform a second temporary Toffoli quantum logic gate on two control qubits and a target qubit.

In some implementations computing a logical-AND of the two control qubits and uncomputing the logical-AND of the two control qubits comprises performing six T gates.

In some implementations computing a logical-AND of the two control qubits and storing the computed logical-AND in the state of the ancilla qubit comprises: applying a CNOT gate between the ancilla qubit in the |A> state and a first control qubit; applying the Hermitian conjugate of a T gate to the ancilla qubit; applying a CNOT gate between the ancilla qubit and a second control qubit; applying a T gate to the ancilla qubit; applying a CNOT gate between the ancilla qubit and the first control qubit; applying the Hermitian conjugate of a T gate to the ancilla qubit; and applying a Hadamard gate to the ancilla qubit to store the logical AND of the two control qubits in the state of the ancilla qubit.

In some implementations the method further comprises applying a S gate to the ancilla qubit storing the logical-AND of the two control qubits.

In some implementations recovering the A-state of the ancilla qubit by replacing the state of the ancilla qubit storing the computed logical-AND of the two control qubits with an A-state comprises: applying a Hadamard gate to the ancilla qubit storing the logical-AND of the two control qubits; applying a T gate to the ancilla qubit; applying a CNOT gate between the ancilla qubit and a first control qubit; applying the Hermitian conjugate of a T gate to the ancilla qubit; applying a CNOT gate between the ancilla qubit and a second control qubit; applying a T gate to the ancilla qubit; and applying a CNOT gate between the ancilla qubit and the first control qubit to leave the ancilla qubit in an |A> state.

In some implementations the method further comprises applying a S gate to the ancilla qubit.

In general, another innovative aspect of the subject matter described in this specification can be implemented in a method for performing a temporary logical AND operation on two control qubits, the method comprising: obtaining an ancilla qubit in an A-state; computing a logical-AND of the two control qubits and storing the computed logical-AND in the state of the ancilla qubit, comprising replacing the A-state of the ancilla qubit with the logical-AND of the two control qubits; maintaining the ancilla qubit storing the logical-AND of the two controls until a first condition is satisfied; and erasing the ancilla qubit when the first condition is satisfied.

The foregoing and other implementations can each optionally include one or more of the following features, alone or in combination. In some implementations maintaining the ancilla qubit storing the logical-AND of the two controls until a first condition is satisfied comprises providing the ancilla qubit storing the logical-AND of the two control qubits as a resource for one or more additional operations.

In some implementations the one or more additional operations comprise operations that would otherwise be conditioned on the two control qubits.

In some implementations erasing the ancilla qubit when the first condition is satisfied comprises erasing the ancilla qubit when the one or more additional operations have been performed.

In some implementations erasing the ancilla qubit comprises transitioning the ancilla into a state that is independent of the state of the two control qubits and does not cause the two control qubits to decohere.

In some implementations erasing the ancilla qubit comprises applying a measure-and-correct process.

In some implementations the measure-and-correct process comprises: applying a Hadamard quantum logic gate to the ancilla qubit; measuring the ancilla qubit to generate a measurement result; in response to determining that the generated measurement result indicates that the two control qubits are both ON, applying a CZ gate.

In some implementations the measure-and-correct process comprises Clifford operations.

In some implementations the method further comprises correcting phase errors by applying an uncontrolled S gate to the ancilla qubit.

In some implementations computing the logical-AND of the two control qubits comprises applying three T gates, optionally approximately in parallel.

The subject matter described in this specification can be implemented in particular ways so as to realize one or more of the following advantages.

The presently described disclosure represents a significant and widely applicable improvement to the state of the art in synthesizing quantum circuits with low T gate counts.

For example, for quantum circuits produced using previously known methods, addition operations typically have a T-count of 8n+O(1) with n representing the number of qubits that the circuit operates on. For quantum circuits produced using the presently disclosed techniques, the T-count of addition operations is halved to 4n+O(1). In particular, the presently disclosed techniques includes a construction called a temporary AND gate that uses four T gates to store the logical-AND of two qubits into an ancilla qubit and zero T gates to later erase the ancilla qubit. Temporary AND gates may be a useful tool when optimizing T-count, and can be applied to integer arithmetic, modular arithmetic, rotation synthesis, the quantum Fourier transform, Shor's algorithm, Grover oracles, and many other circuits. In addition, because T gates dominate the cost of quantum computation based on the surface code, and the temporary AND gate is widely applicable, the disclosed constructions represent a significant reduction in projected costs of quantum computation.

Furthermore, the presently disclosed techniques further include the construction of an n-bit controlled adder circuit with T-count of 8n+O(1), and a temporary adder that can be computed for the same cost as the normal adder but whose result can be kept until later un-computed without using T gates.

Details of one or more implementations of the subject matter of this specification are set forth in the accompanying drawings and the description below. Other features, aspects, and advantages of the subject matter will become apparent from the description, the drawings, and the claims.

DETAILED DESCRIPTION

The surface code is a quantum error correcting code that may operate on a two dimensional (2D) nearest-neighbor array of qubits and achieve a threshold error rate of approximately 1%. This makes the surface code a likely component in the architecture of future error corrected quantum computers, since 2D arrays of qubits with nearest-neighbor connections may be implemented using many qubit technologies and other known error correcting codes have lower thresholds or require stronger connectivity.

One downside of the surface code is that it has no cheap mechanism to apply non-Clifford operations such as T gates that perform 45 degree rotations around the Z axis of the Bloch sphere. Instead, T gates are performed by distilling and consuming $$|A\rangle = \frac{1}{\sqrt{2}}\left(|0\rangle + e^{\frac{i\pi}{4}}|1\rangle\right)$$

states. Consuming an $|A\rangle$ state to perform a T gate is simple, but distilling $|A\rangle$ states has significant cost. Because T gates are so expensive for the surface code, and the surface code is a likely component of future quantum computers, it may be advantageous to reduce the number of T gates used by quantum circuits to perform certain quantum computing operations.

This specification describes methods and constructions that may be implemented in a quantum circuit on a quantum device for improving the number of T gates needed to perform a first Toffoli gate that is later un-computed by a second Toffoli gate. The first Toffoli gate is performed indirectly by targeting a clean ancilla qubit and then using the ancilla qubit to toggle the intended target. The ancilla qubit is not un-computed and re-computed if it will be provided as a resource for additional operations. If a T gate is used to compute or un-compute an $|A\rangle$ state, an $|A\rangle$ state is passed in or recovered. The ancilla qubit is un-computed by measurement of the ancilla qubit and application of a classically controlled operation (also described as a measure-and-correct process herein).

In this specification, initializing the ancilla qubit is referred to as "computing the logical-AND of the controls", un-computing the ancilla qubit as "erasing the logical-AND", and the combination of both pieces as a "temporary AND gate".

Example Toffoli Constructions

Figure 1:
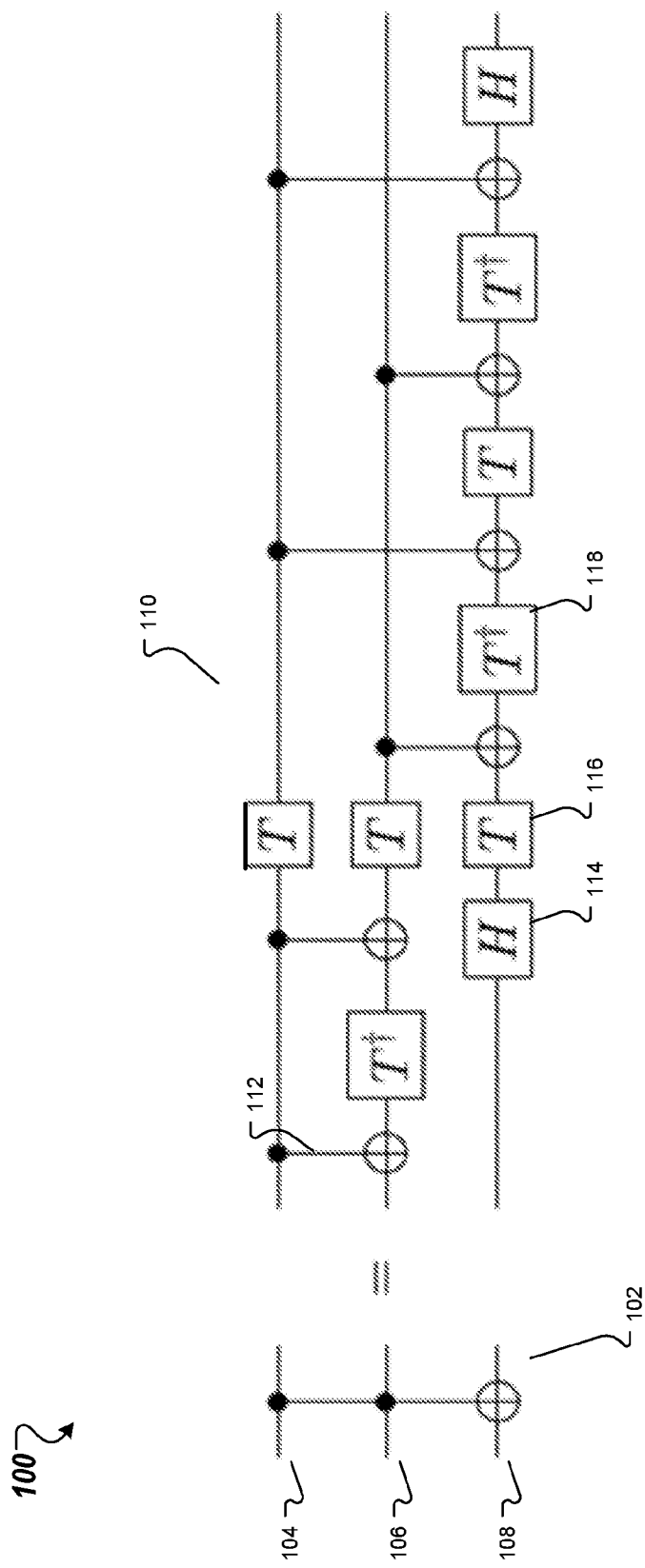
FIG. 1 is an exemplary circuit representation of a Toffoli construction.

FIG. 1 is a circuit representation 100 of a Toffoli construction. A Toffoli gate is a universal reversible quantum logic gate. A Toffoli gate acts on three qubits. If the first two qubits are in the state |1>, the Toffoli gate 102 flips the state of the third qubit and otherwise leaves it unchanged. In FIG. 1, the Toffoli gate 102 acts on three qubits represented by the three parallel horizontal lines 104, 106 and 108. In FIG. 1, qubits 104 and 106 represent control qubits, and qubit 108 represents a target qubit. A Toffoli gate can be implemented using the construction 110. The construction 110 includes eight Clifford gates—Controlled-NOT (CNOT) gates, e.g., CNOT gate 112, and Hadamard gates, e.g., Hadamard gate 114. The expanded circuit representation 110 includes seven T gates, e.g., T gate 116 and 118.

Under the assumption that the construction 110 is not permitted to involve other qubits or to share work with other operations, this construction was previously considered optimal. Otherwise, the construction may be optimized. For example, in cases where N adjacent Toffoli gates share the same control qubits, the multiple Toffoli gates may be replaced by N−1 CNOT gates and one Toffoli gate. The T-count of N adjacent Toffoli gates sharing the same controls is therefore 0·N+O(1), where the marginal T-count is zero because each additional Toffoli can be replaced with CNOTs framing a root Toffoli.

It may not be common for adjacent Toffoli gates to have the same control qubits, however it may be common for a first Toffoli to later be un-computed by a second matching Toffoli, that is for the effect of the first Toffoli gate to be temporary. When this occurs, the three T gates on the control qubits of the construction shown above with reference to FIG. 1 can be omitted. In some cases, this may introduce phase errors. However the second Toffoli gate can un-compute those errors while un-computing the state permutation.

Based on the Toffoli gate construction described with reference to FIG. 1, an n-bit quantum adder may contain 2n+O(1) Toffoli gates, which in turn implies a naive T-count of 14n+O(1). However, almost all of the Toffoli gates in the first half of an adder are un-computed by Toffoli gates in the second half. This allows the T gates on the controls of the Toffoli gates to be omitted, reducing their T-count from 7 to 4 and the T-count of addition to 8n+O(1). Even if a Toffoli is not paired with a second Toffoli that un-computes its effects, it is still possible to perform the Toffoli with T-count of 4 by using an ancilla qubit, a measurement, and a conditional fixup operation.

Example Hardware

Figure 2:
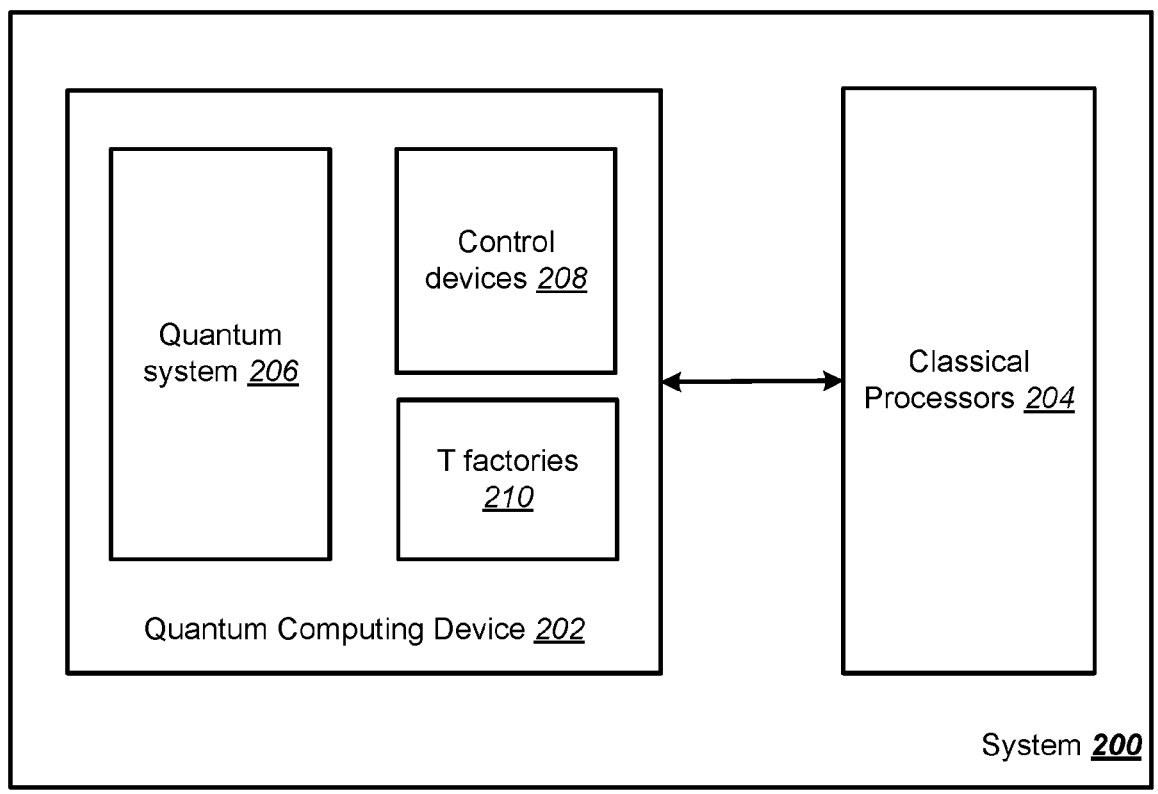
FIG. 2 depicts an exemplary system for implementing temporary Toffoli gates and logical AND operations.

FIG. 2 depicts an exemplary system 200 for implementing temporary Toffoli gates and logical AND operations. The system 200 is an example of a system implemented as quantum or classical computer programs on one or more quantum computing devices or classical computers in one or more locations, in which the systems, components, and techniques described below can be implemented.

The system 200 includes a quantum computing device 202 in data communication with one or more classical processors 204. The quantum computing device 202 includes components for performing quantum computation. For example, the quantum computing device 202 includes a quantum system 206, control devices 208, and T factories 210. The quantum system 206 includes one or more multi-level quantum subsystems, e.g., a register of qubits. In some implementations the multi-level quantum subsystems may be superconducting qubits, e.g., Gmon qubits. The type of multi-level quantum subsystems that the system 100 utilizes may vary. For example, in some cases it may be convenient to include one or more resonators attached to one or more superconducting qubits, e.g., Gmon or Xmon qubits. In other cases ion traps, photonic devices or superconducting cavities (with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 206 via multiple control lines that are coupled to multiple control devices 208. Example control devices 208 that operate on the register of qubits include quantum logic gates or circuits of quantum logic gates, e.g., Hadamard gates, controlled-NOT (CNOT) gates, controlled-phase gates, or T gates. In some implementations T gates may be stored in one or more T factories 210 included in the quantum computing device 202.

The control devices 208 may further include measurement devices, e.g., readout resonators. Measurement results obtained via measurement devices may be provided to the classical processors 204 for processing and analyzing.

Method for Reusing |A⟩ States

One innovative aspect of present disclosure describes a construction that improves the T-count of a single Toffoli gate by performing the Toffoli indirectly instead of directly.

Figure 3:
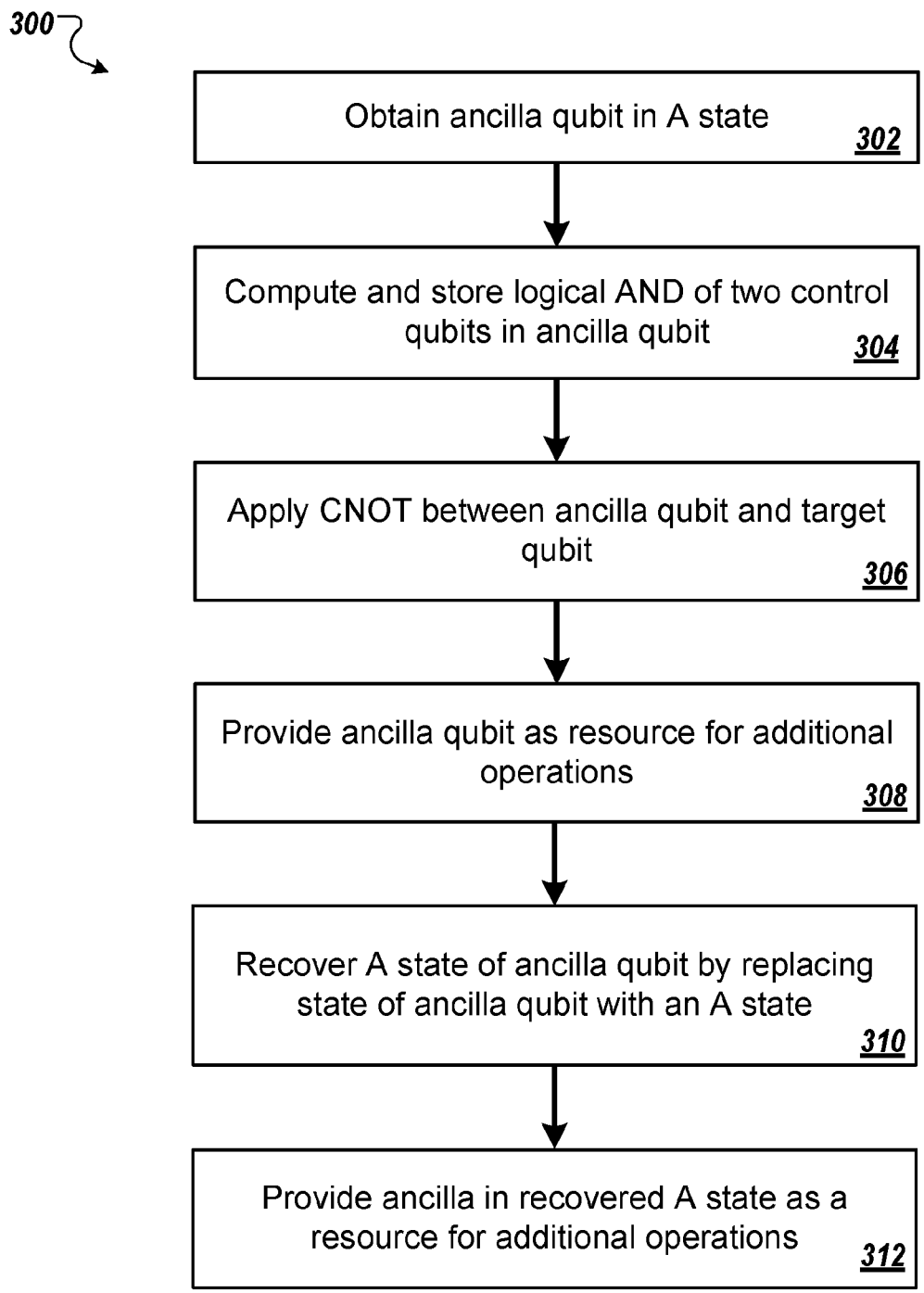
FIG. 3 is a flow diagram of an exemplary process for indirectly performing a Toffoli gate on two control qubits and a target qubit.

FIG. 3 is a flow diagram of an example process 300 for indirectly performing a Toffoli gate on two control qubits and a target qubit. For convenience, the process 300 will be described as being performed by a quantum computing device in communication with one or more classical computing devices located in one or more locations. For example, the system 200 of FIG. 2, appropriately programmed in accordance with this specification, can perform the process 300.

The system obtains an ancilla qubit in an A-state (step 302).

The system computes a logical-AND of the two control qubits and stores the computed logical-AND in the state of the ancilla qubit by replacing the A-state of the ancilla qubit with the logical-AND of the two control qubits (step 304). To compute a logical-AND of the two control qubits and store the computed logical-AND in the state of the ancilla qubit, the system may first apply a CNOT gate between the ancilla qubit in the |A⟩ state and a first control qubit. The system may then apply the Hermitian conjugate of a T gate to the ancilla qubit. The system may then apply a CNOT gate between the ancilla qubit and a second control qubit. The system may then apply a T gate to the ancilla qubit. The system may then apply a CNOT gate between the ancilla qubit and the first control qubit. The system may then apply the Hermitian conjugate of a T gate to the ancilla qubit. The system may then apply a Hadamard gate to the ancilla qubit to store the logical AND of the two control qubits in the state of the ancilla qubit. An example circuit representation of computing a logical-AND of two control qubits and storing the computed logical-AND in the state of an ancilla qubit is illustrated below with reference to FIG. 4.

In some implementations the computation performed in step 304 may introduce phase errors. Such phase errors may be corrected by applying a controlled-S quantum logic gate to the two control qubits. The effect of an application of a controlled-S gate $S=\text{diag}(1,e^{i\pi/2})$ to the two control qubits is to apply a phase factor of i to the amplitudes of computational basis states where both controls are on. Since the output of the step 304 is a qubit whose state indicates whether or not both control qubits are on, the controlled-S gate on the two control qubits can be replaced with an uncontrolled-S gate on the ancilla qubit storing the logical-AND of the two control qubits.

The system applies a CNOT quantum logic gate between (i) the ancilla qubit storing the logical-AND of the two control qubits, and (ii) the target qubit, the ancilla qubit acting as a control qubit for the CNOT quantum logic gate (step 306).

The system provides the ancilla qubit storing the logical-AND of the two control qubits as a resource for one or more additional operations (step 308).

The system un-computes the logical-AND of the two control qubits and recovers the A-state of the ancilla qubit by replacing the state of the ancilla qubit storing the computed logical-AND of the two control qubits with an A-state (step 310).

For example, the system may apply a Hadamard gate to the ancilla qubit storing the logical-AND of the two control qubits. The system may then apply a T gate to the ancilla qubit. The system may then apply a CNOT gate between the ancilla qubit and a first control qubit. The system may then apply the Hermitian conjugate of a T gate to the ancilla qubit. The system may then apply a CNOT gate between the ancilla qubit and a second control qubit. The system may then apply a T gate to the ancilla qubit. The system may then apply a CNOT gate between the ancilla qubit and the first control qubit to leave the ancilla qubit in an |A> state. An example circuit representation of un-computing a logical-AND of two control qubits and recovering an A-state of an ancilla qubit is illustrated below with reference to FIG. 4.

In cases where the system applies an S gate during the computation of the logical AND described above with reference to step 304, the system may apply the Hermitian adjoint of the S gate prior to applying the first Hadamard gate to the ancilla qubit storing the logical AND of the two control qubits.

The system provides the ancilla qubit in the recovered A-state as a resource for one or more additional operations (step 312). For example, the system may provide the ancilla qubit in the A-state to perform a T gate.

In some implementations a first iteration of the process 300 may be used to perform a first temporary Toffoli quantum logic gate on two first control qubits and a first target qubit. The system may then provide the ancilla qubit in the recovered A-state as a resource for a second iteration of the process 300 on two second control qubits and a second target qubit.

Figure 4:
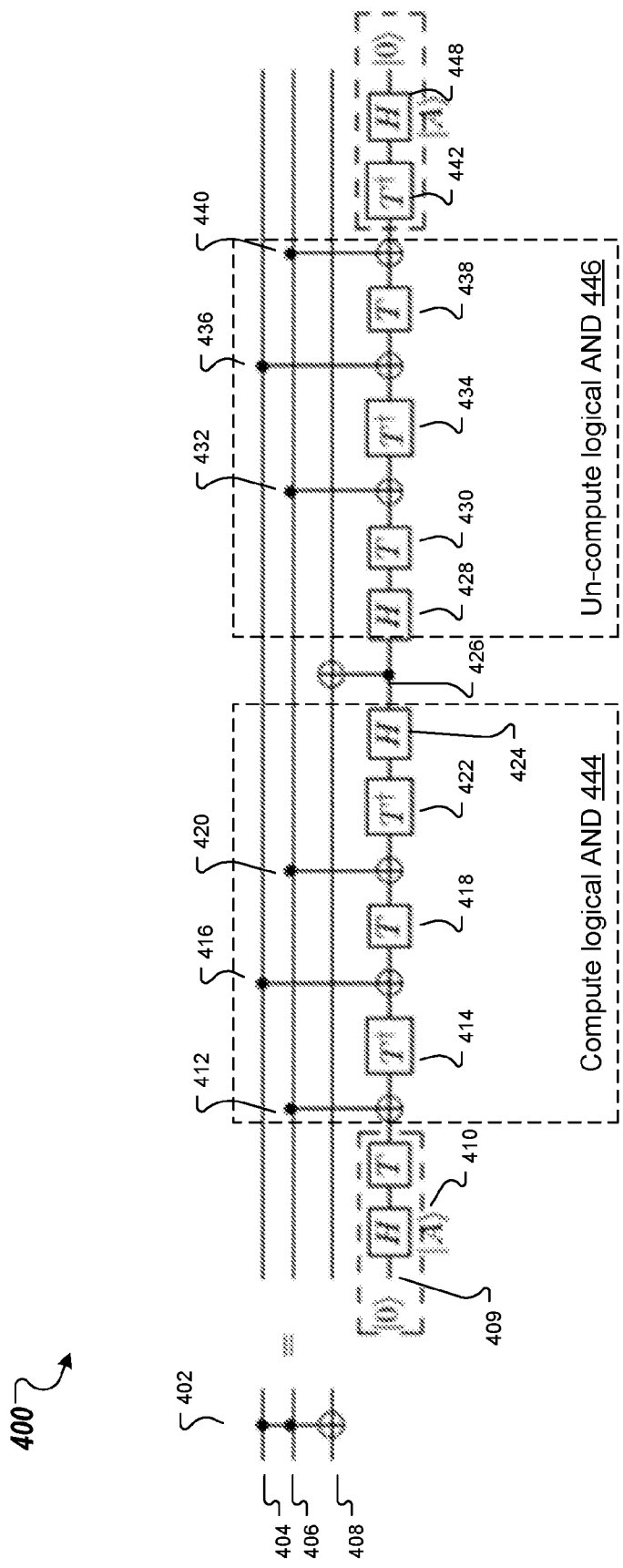
FIG. 4 is an illustration of an exemplary quantum circuit for indirectly performing a Toffoli gate on two control qubits and a target qubit.

FIG. 4 is an illustration 400 of an example quantum circuit for indirectly performing a Toffoli gate 402 on two control qubits and a target qubit, as described above with reference to process 300 of FIG. 3. In illustration 400, a first control qubit of the two control qubits is represented by horizontal line 406. A second control qubit of the two control qubits is represented by horizontal line 404. Horizontal line 408 represents the target qubit.

To perform the Toffoli gate 402 on the two control qubits 404, 406 and target qubit 408, an ancilla qubit, represented by horizontal line 409, in an A-state 410 is obtained. For example, the ancilla qubit 409 may be prepared in a 0-state. A Hadamard gate and T gate may be applied to the ancilla qubit in the 0-state to obtain the A-state.

The logical AND of the two control qubits 404, 406 is computed 444 and stored in the state of the ancilla qubit 409. This includes application of: a CNOT gate 412 between the ancilla qubit 409 in the |A> state and the first control qubit 406, the Hermitian conjugate of a T gate 414 to the ancilla qubit 409, a CNOT gate 416 between the ancilla qubit 409 and the second control qubit 404, a T gate 418 to the ancilla qubit 409, a CNOT gate 420 between the ancilla qubit 409 and the first control qubit 406, the Hermitian conjugate of a T gate 422 to the ancilla qubit 409, and a Hadamard gate 424 to the ancilla qubit 409.

A CNOT quantum logic gate 426 is applied to (i) the ancilla qubit 409 storing the logical-AND of the two control qubits 404, 406, and (ii) the target qubit 408, the ancilla qubit 409 acting as a control qubit for the CNOT quantum logic gate 426.

The logical AND of the two control qubits 404, 406 is un-computed 446. This includes application of: a Hadamard gate 428 to the ancilla qubit 409 storing the logical-AND of the two control qubits 404, 406, a T gate 430 to the ancilla qubit 409, a CNOT gate 432 between the ancilla qubit 409 and the first control qubit 406, the Hermitian conjugate of a T gate 434 to the ancilla qubit 409, a CNOT gate 436 between the ancilla qubit 409 and the second control qubit 404, a T gate 438 to the ancilla qubit 409, and a CNOT gate 440 between the ancilla qubit 409 and the first control qubit 406. The ancilla qubit 409 may be returned to the 0-state by application of the Hermitian conjugate of a T gate 442 and a Hadamard gate 448.

The indirect-Toffoli construction described with reference to FIGS. 3 and 4 appears to have a T-count of 8. However, the last T gate 442 in the circuit is unnecessary. In fact, in some cases it may be actively harmful. By removing the T gate 442 and the following Hadamard 448, the T-count of the Toffoli gate is reduced from 8 to 7. In addition, the ancilla qubit is left in an |A⟩ state that can be consumed to perform a T gate elsewhere. This improves the net T-count of the Toffoli gate to 6.

This optimization construction may apply to multiple quantum circuits. For example, the optimization may be useful in circuits where an initial Toffoli gate is later un-computed by a second Toffoli gate. Instead of computing and un-computing the ancilla qubit for the first Toffoli gate, then re-computing and re-un-computing the ancilla qubit for the second Toffoli gate, the ancilla qubit may be maintained until the second Toffoli gate is un-computed. This halves the T-count of the pair from 12 to 6, as illustrated in FIG. 5.

Figure 5:
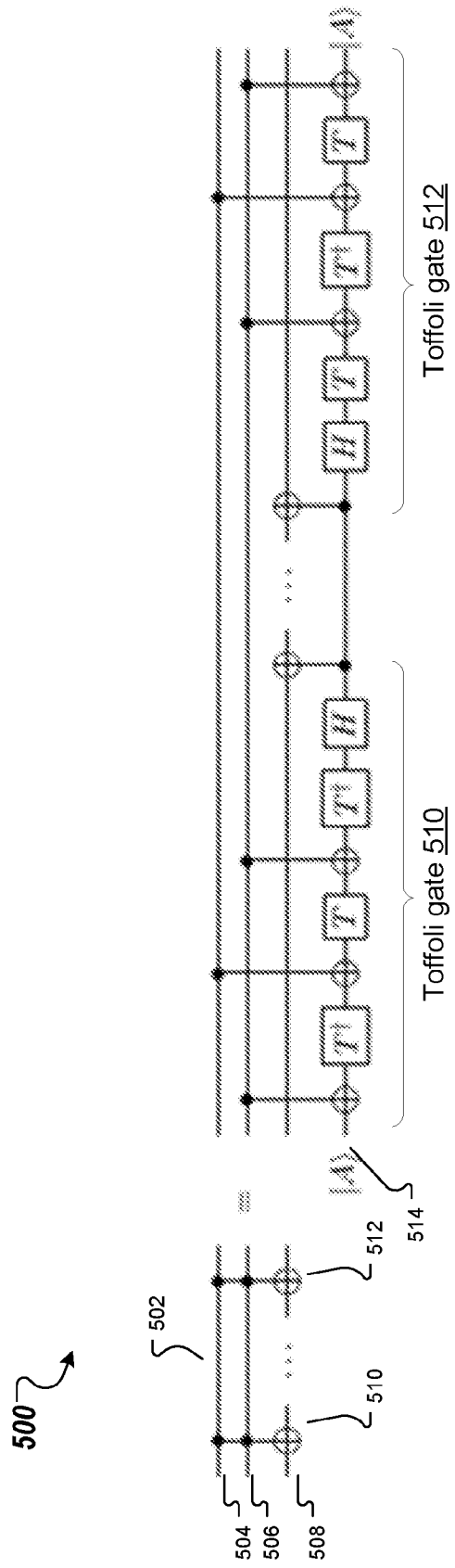
FIG. 5 is an illustration of an exemplary quantum circuit for indirectly performing multiple Toffoli gates on two control qubits and a target qubit.

FIG. 5 is an illustration 500 of an example quantum circuit for computing and un-computing multiple Toffoli gates 502 on two control qubits 504, 506 and a target qubit 508 using an ancilla qubit 514. As shown in illustration 500, maintaining the ancilla qubit until Toffoli gate 512 is un-computed results in a net T-count of 6. Many circuits involve computing and later un-computing a Toffoli, e.g., due to addition operations. Previously, it was believed that each Toffoli gate had a T-count of 4, the pair of Toffoli gates therefore having a T-count of 8. The process and construction described in FIGS. 3 and 4 reduces the T-count of the pair from 8 to 6.

Constructing a Temporary AND

Figure 6:
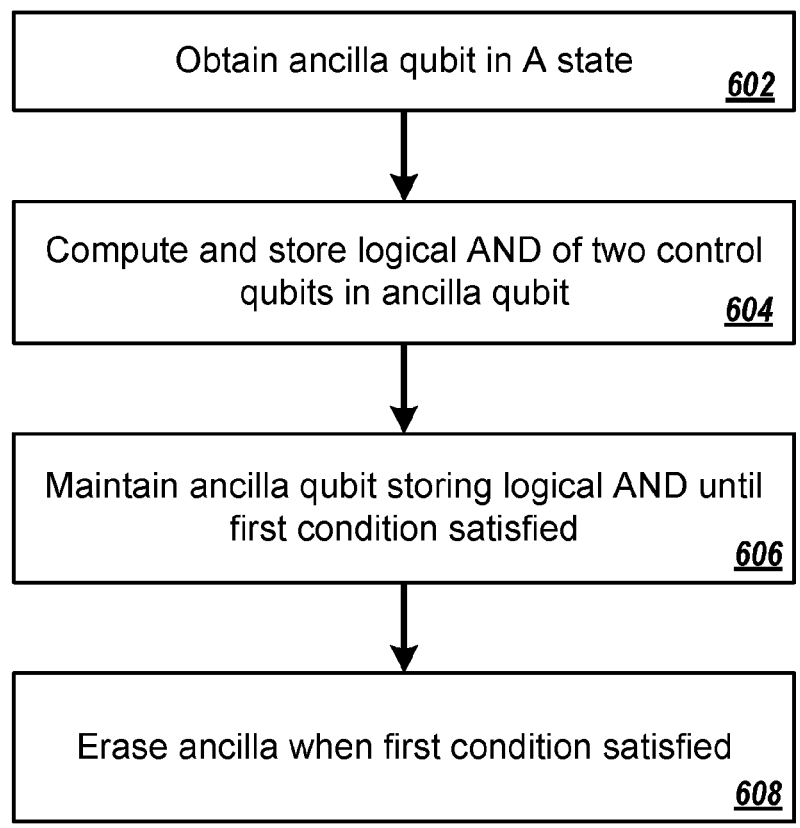
FIG. 6 is a flow diagram of an exemplary process for performing a temporary logical AND operation on two control qubits.

FIG. 6 is a flow diagram of an example process 600 for performing a temporary logical AND operation on two control qubits. For convenience, the process 600 will be described as being performed by a quantum computing device in communication with one or more classical computing devices located in one or more locations. For example, the system 200 of FIG. 2, appropriately programmed in accordance with this specification, can perform the process 600.

The system obtains an ancilla qubit in an A-state (step 602).

The system computes a logical-AND of the two control qubits and stores the computed logical-AND in the state of the ancilla qubit by replacing the A-state of the ancilla qubit with the logical-AND of the two control qubits (step 604). In some implementations, to correct any introduced phase errors, the system may further apply an uncontrolled-S gate to the ancilla qubit. As described above with reference to FIG. 3, computing the logical-AND of the two control qubits includes applying three T gates, optionally approximately in parallel.

The system maintains the ancilla qubit storing the logical-AND of the two controls until a first condition is satisfied (step 606). In some implementations maintaining the ancilla qubit storing the logical-AND of the two control qubits may include providing the ancilla qubit as a resource for one or more additional operations, e.g., operations that would otherwise be conditioned on the two control qubits.

The system erases the ancilla qubit when the first condition is satisfied (step 608). For example, the system may erase the ancilla qubit when the one or more additional operations described above with reference to step 606 have been performed. In some implementations erasing the ancilla qubit may include transitioning the ancilla qubit into a state that is independent of the state of the two control qubits and does not cause the two control qubits to decohere.

To erase the ancilla qubit, the system may apply a measure-and-correct process that includes one or more Clifford operations (with no T-count) instead of un-computing the ancilla qubit using a mirror of the process used to compute the ancilla qubit. By starting with a process that obviously performs the un-computation, e.g., as described above with reference to FIG. 3, the process can be altered to generate the measure-and-correct process. The un-computation process described in FIG. 3 includes a Toffoli gate, which clears the ancilla qubit since the ancilla qubit was computed with a Toffoli gate and Toffoli gates are their own inverse. Since the cleared ancilla qubit is eventually discarded, it is possible to apply a Hadamard gate and a measurement to it after the Toffoli gate but before discarding it. The Hadamard may then be hopped over the Toffoli gate, transforming it into a CCZ operation. The CCZ may be rearranged so that the ancilla qubit is one a control qubit, which is possible because the control qubits and target qubit of a CCZ are interchangeable. Finally, the deferred measurement principle may be invoked to hop the measurement over the CCZ, turning the quantum control into a classical control. That is, to perform the measure-and-correct process the system may apply a Hadamard quantum logic gate to the ancilla qubit, measure the ancilla qubit to generate a measurement result and analyze the generated measurement result. In response to determining that the generated measurement result indicates that the two control qubits are both ON, the system may apply a CZ gate to the control qubits.

Figure 7:
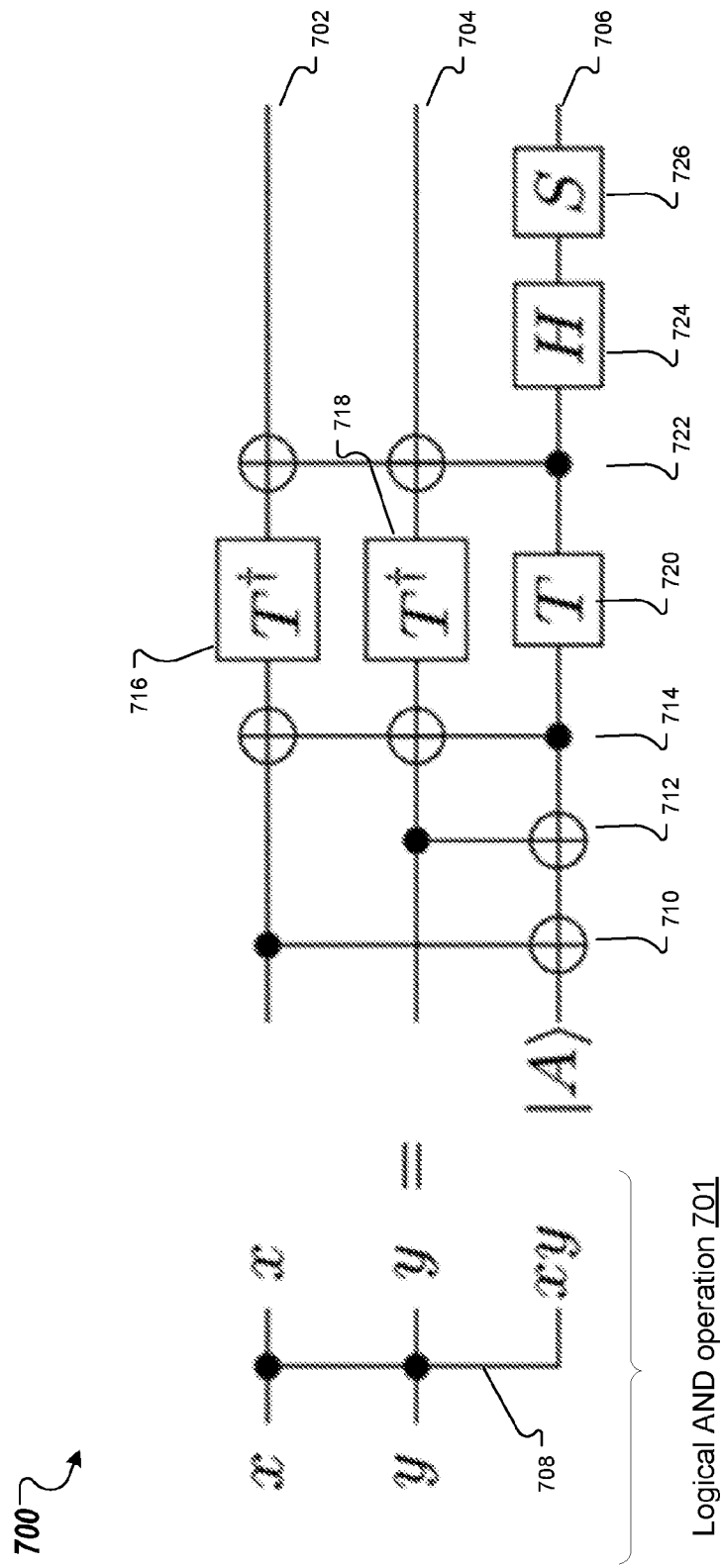
FIG. 7 is an illustration of an exemplary quantum circuit for performing a temporary logical AND operation on two control qubits.

FIG. 7 is an illustration 700 of an example quantum circuit for performing a temporary logical AND operation 701 on two control qubits 702, 704. As shown in illustration 700, the computation of the logical AND gate is drawn as an ancilla qubit wire 708 emerging vertically from two controls then heading rightward.

Performing the temporary logical AND operation 701 includes obtaining an ancilla qubit 706 in an A-state, applying a CNOT gate 710 between the first control qubit 702 and the ancilla qubit 706, applying a CNOT gate 712 between the second control qubit 704 and the ancilla qubit 706, applying two CNOT gates 714 between the first control qubit 702, second control qubit 704 and ancilla qubit 706 (the order of which is irrelevant), applying a Hermitian conjugate of a T gate 716, 718 to the first control qubit 702 and to the second control qubit 704 and a T gate 720 to the ancilla qubit 706 (the T gates 716, 718, 720 may be applied approximately in parallel), applying two CNOT gates 722 between the first control qubit 702, second control qubit 704 and ancilla qubit 706 (the order of which is irrelevant), applying a Hadamard gate 724 to the ancilla qubit 706 and, optionally, applying a S gate 726 to the ancilla qubit 706. The T count of the operation 701 is therefore 4 (including the T gate required to prepare the A-state of the ancilla qubit 706).

Figure 8:
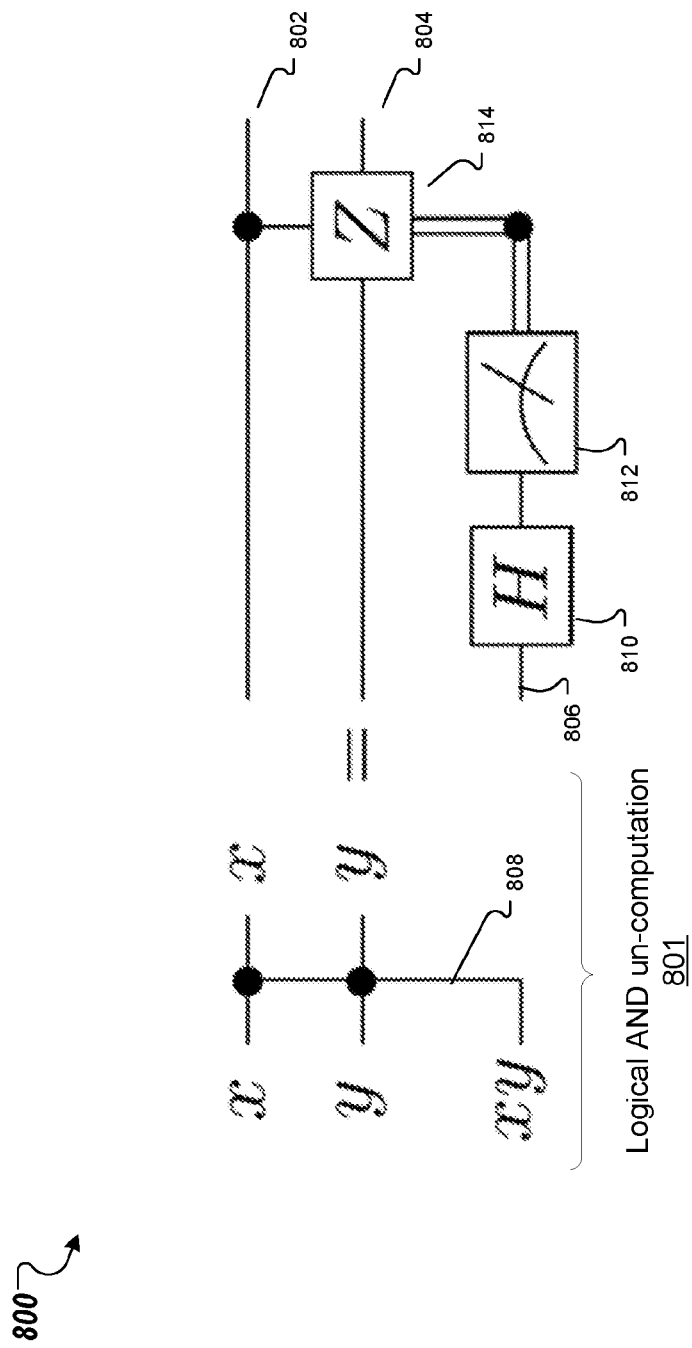
FIG. 8 is an illustration of an exemplary quantum circuit for un-computing a temporary logical AND operation on two control qubits.

FIG. 8 is an illustration 800 of an example quantum circuit for un-computing a temporary logical AND operation 801 on two control qubits 802, 804. As shown in illustration 800, the un-computation of the logical AND gate 802 is drawn as an ancilla qubit wire 808 coming in from the left then merging vertically into the two control qubits 802, 804 that created it.

Un-computing the temporary logical AND operation 801 includes performing a measure-and-correct process. A Hadamard gate 810 is applied to the ancilla qubit 806. The ancilla qubit 806 is measured 812. A CZ gate 814 is applied to the control qubits 802, 804 if the generated measurement result from measurement operation 812 indicates that the two control qubits 802, 804 are both ON. The T count of the operation 801 is zero.

Applications

The above described processes and constructions may be used improve the complexity of several quantum circuits. For example, known adder constructions such as the Cuccaro adder contain many Toffoli gates that are later un-computed by another Toffoli. The presently described processes and constructions do not fundamentally change the structure of such known adders. Therefore, an improved adder construction based on temporary Toffoli gates may be synthesized using the above described temporary AND gate construction, halving the T count of the adder.

Figure 9:
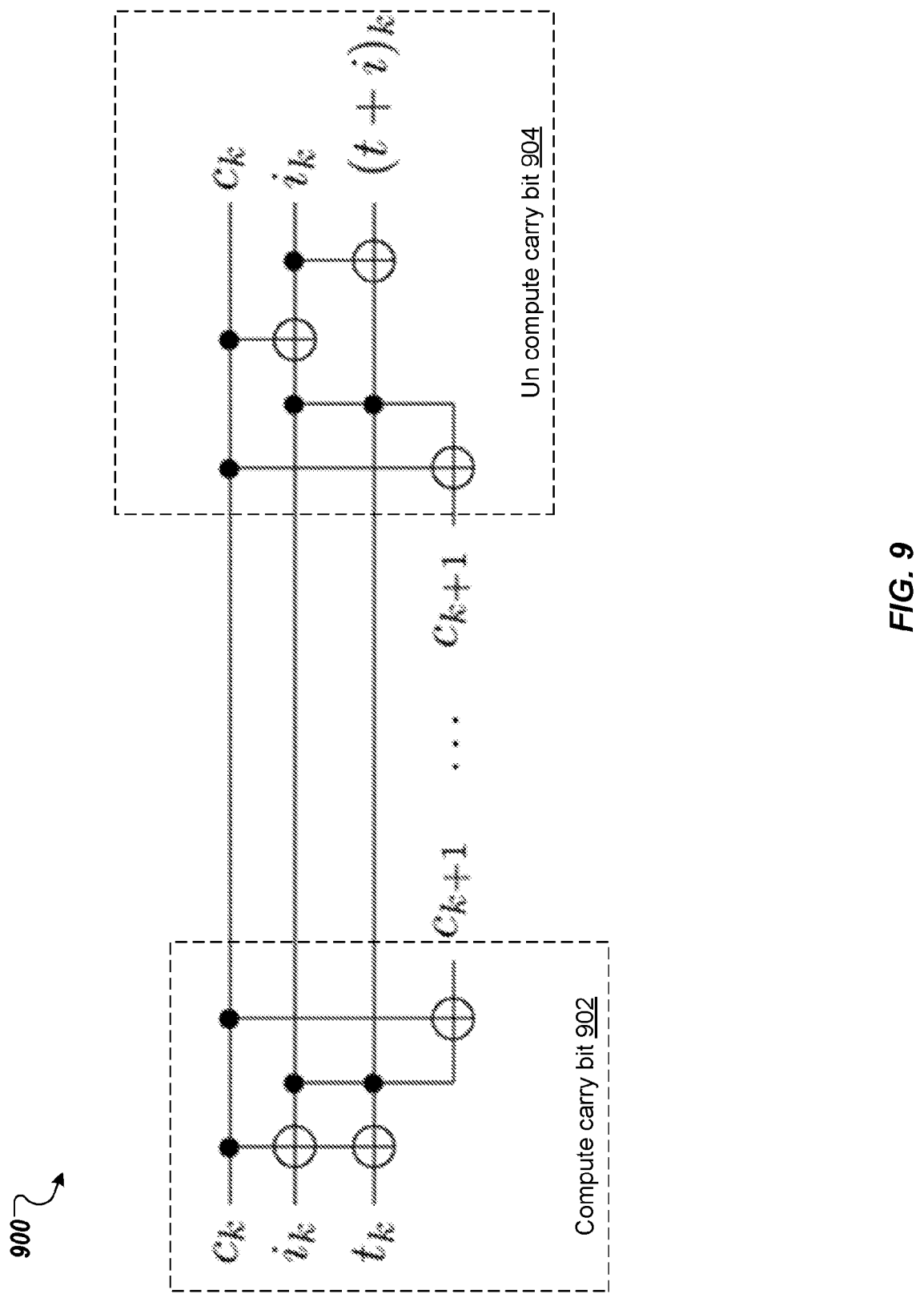
FIG. 9 is an illustration of a per-bit building block of an improved adder construction with a T count of 4.

FIG. 9 illustrates a per-bit building block 900 of an improved adder construction with a T count of 4. The building block 900 may be used as part of a ripple-carry approach to performing addition, and can be used to construct an n-bit adder by nesting n copies of the building block 900 inside of each other. The compute carry bit box 902 represents computation of the majority of the three input bits $c_k$, $i_k$, $t_k$, that is whether or not the sum of the three bits will cause a carry into the next bit k+1, and storing of the computed majority into the new wire that will feed into the next bit's k+1 adder. The un-compute carry bit box 904 represents the inverse operations of the majority computed in the compute carry bit box 902, as well as operations for ensuring that the output bit has been toggled if the input bit is on.

Figure 10:
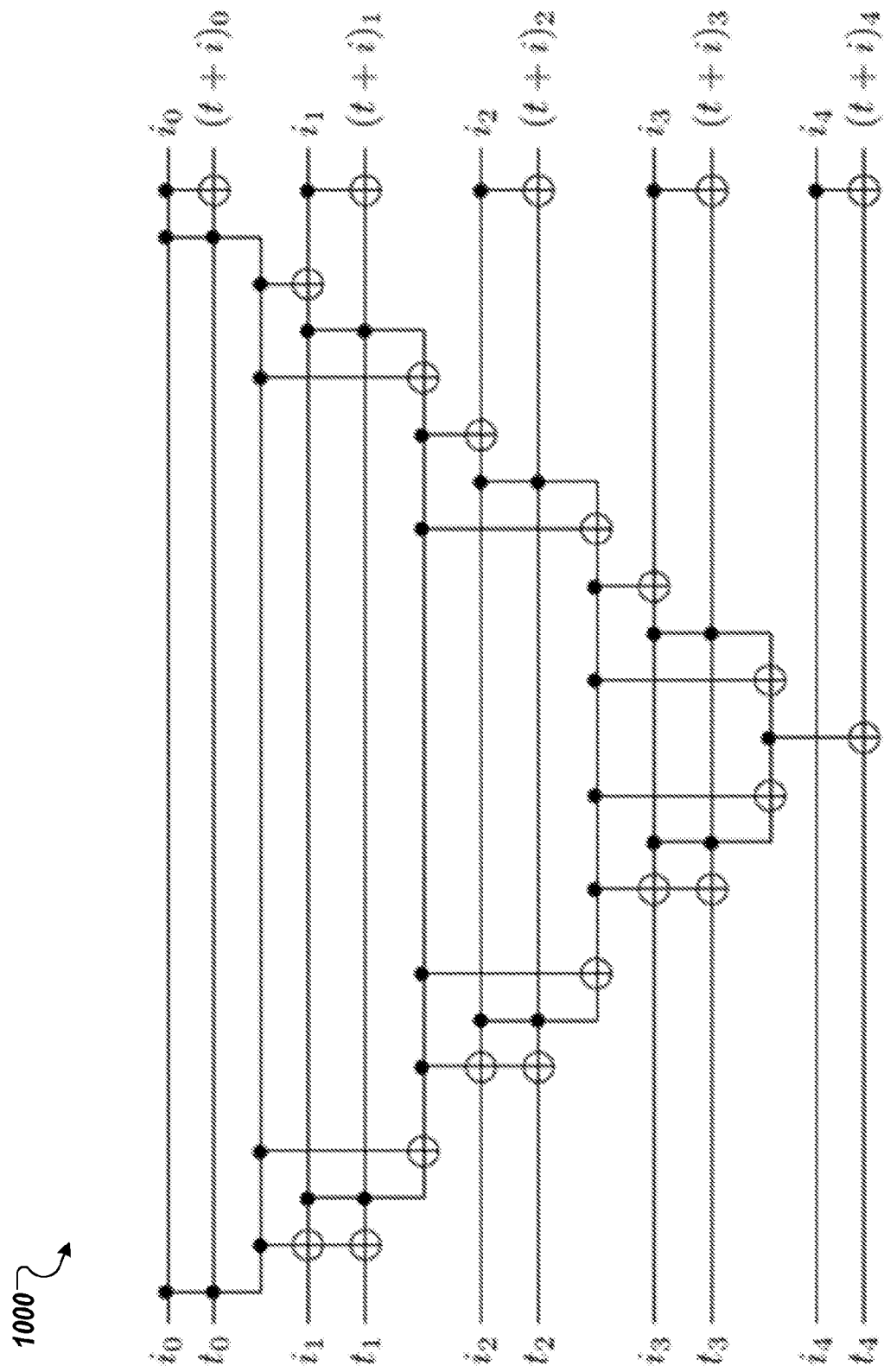
FIG. 10 is an illustration a 5 bit adder with a T count of 16.

FIG. 10 is an illustration a 5 bit adder with a T count of 16, constructed by tiling the per-bit building block 900 shown in FIG. 9. Since the low bit corresponding to does not have a carry-in, the circuit has been optimized to omit that part. Also, since the high bit doesn't have a carry-out, that has also been optimized to omit that part. The bits corresponding to the input register are labelled i0, i1, i2, i3, i4. The target bits are labelled t0, t1, t2, t3, t4. After the circuit has been performed, the target bits have been modified such that the target register's new value is the sum of the input and the target register's old value, e.g., (t+i)1.

The building block 900 for the improved adder construction can be modified such that the sum computed by the adder can be made available for use as soon as the carry signal hits the first control bit—instead of needing to wait for the un-computation sweep to finish. This can halve the T-count of the addition when it is going to be un-computed. Instead of using 4n+O(1) T gates to compute the addition, and then 4n+O(1) more T gates to un-compute the addition, the intermediate state of a single addition computation is utilized.

Furthermore, in some cases additions may be conditioned on a control qubit, e.g., additions performed in Shor's algorithm. In some cases a controlled-addition construction may have a T-count of 21n+O(1). Using the presently described temporary AND gate construction can improve this to 8n+O(1).

The presently described temporary AND gate may also be applicable to other operations. For example, temporary AND operations can be useful for applying phase rotations to multiple qubits approximately simultaneously. Given a b-bit ancilla register G prepared in the state $$2^{-b/2} \sum_{k=0}^{2^b-1} e^{\frac{2i\pi k}{2^b}} |k> a(\text{a 'phase gradient state'}).$$

using the adder construction described above to add a register Q into G will cause phase kickback that applies the operation $$grad = \sum_{k=0}^{2^b-1} e^{\frac{2i\pi k}{2^b}} |k><k|$$

to Q. The Grad operation is equivalent to applying the phase gate $Z^{2^{-k}}$ to the qubit position at k for each qubit within Q. Since some quantum Fourier transform circuits involve conditional uses of Grad, temporary-AND operations may be used to improve the T-count of those circuits.

In some cases it may be estimated that factoring a 2000-bit number may take 27 hours and $2 \times 10^{12}$ distilled IA) states. This time estimate is based on each Toffoli having a T-depth of 1, and the IA) state count estimate is based on Toffoli gates having a T-count of 7. The presently described processes and constructions reduce many existing estimates of the cost of quantum computation, improving the computational efficiency of quantum computations. For example, because Shor's algorithm is dominated by the cost of additions, the presently described techniques multiply the T-count and T depth for factoring a 2000-bit number by 4/14 and 1/3, respectively. This reduces the estimates to 9 hours and $6 \times 10^{11}$ distilled IA) states.

Other examples of operations implemented by quantum devices which benefit from cheaper temporary AND gates include but are not limited to: integer comparisons, integer multiplication, incrementing and counting, integer arithmetic in general, modular arithmetic, expanding a binary register into a unary register, operations with a target qubit indexed by a binary qubit register, phasing a register by a computable function f (i.e. applying the operation), temporary permutations, or oracles in Grover's algorithm.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for performing a temporary Toffoli quantum logic gate on two first control qubits and a first target qubit, the method comprising:
   obtaining an ancilla qubit in an A-state;
   computing a logical-AND of the two first control qubits and storing the computed logical-AND in the state of the ancilla qubit, comprising replacing the A-state of the ancilla qubit with the logical-AND of the two first control qubits;
   applying a CNOT quantum logic gate between (i) the ancilla qubit storing the logical-AND of the two first control qubits, and (ii) the target qubit, the ancilla qubit acting as a control qubit for the CNOT quantum logic gate;
   providing the ancilla qubit storing the logical-AND of the two first control qubits as a resource for one or more additional operations;
   uncomputing the logical-AND of the two first control qubits, comprising recovering the A-state of the ancilla qubit by replacing the state of the ancilla qubit storing the computed logical-AND of the two first control qubits with an A-state; and
   providing the ancilla qubit in the recovered A-state as a resource for one or more additional operations.

2. The method of claim 1, wherein providing the ancilla qubit in the A-state as the resource for one or more additional operations comprises providing the ancilla qubit in the A-state to perform a T gate.

3. The method of claim 1, wherein the method is used to perform a first temporary Toffoli quantum logic gate on the two first control qubits and the first target qubit, and wherein providing the ancilla qubit in the recovered A-state as the resource for one or more additional operations comprises providing the ancilla qubit in the recovered A-state to perform a second temporary Toffoli quantum logic gate on two second control qubits and a second target qubit.

4. The method of claim 1, wherein computing the logical-AND of the two first control qubits and uncomputing the logical-AND of the two first control qubits comprises performing six T gates.

5. The method of claim 1, wherein computing the logical-AND of the two first control qubits and storing the computed logical-AND in the state of the ancilla qubit comprises:
   applying a CNOT gate between the ancilla qubit in the |A> state and a first one of the two first control qubits;
   applying the Hermitian conjugate of a T gate to the ancilla qubit;
   applying a CNOT gate between the ancilla qubit and a second one of the two first control qubits;
   applying a T gate to the ancilla qubit;
   applying a CNOT gate between the ancilla qubit and the first one of the two first control qubits;
   applying the Hermitian conjugate of a T gate to the ancilla qubit; and
   applying a Hadamard gate to the ancilla qubit to store the logical AND of the two first control qubits in the state of the ancilla qubit.

6. The method of claim 5, further comprising applying a S gate to the ancilla qubit storing the logical-AND of the two first control qubits.

7. The method of claim 1, wherein recovering the A-state of the ancilla qubit by replacing the state of the ancilla qubit storing the computed logical-AND of the two first control qubits with the A-state comprises:
   applying a Hadamard gate to the ancilla qubit storing the logical-AND of the two first control qubits;
   applying a T gate to the ancilla qubit;
   applying a CNOT gate between the ancilla qubit and a first one of the two first control qubits;
   applying the Hermitian conjugate of a T gate to the ancilla qubit;
   applying a CNOT gate between the ancilla qubit and a second one of the two first control qubits;
   applying a T gate to the ancilla qubit; and
   applying a CNOT gate between the ancilla qubit and the first one of the two first control qubits to leave the ancilla qubit in the |A> state.

8. The method of claim 7, further comprising applying a S gate to the ancilla qubit.

9. A quantum computing device comprising:
   a register of qubits comprising two first control qubits, a first target qubit, and an ancilla qubit prepared in an initial state;
   a plurality of control lines coupled to the register of qubits;
   a plurality of control circuits coupled to the plurality of control lines; and
   one or more computer-readable devices, including therein instructions that, when executed by one or more processors, cause the quantum computing device to perform operations that include:
   obtaining an ancilla qubit in an A-state;
   computing a logical-AND of the two first control qubits and storing the computed logical-AND in the state of the ancilla qubit, comprising replacing the A-state of the ancilla qubit with the logical-AND of the two first control qubits;
   applying a CNOT quantum logic gate between (i) the ancilla qubit storing the logical-AND of the two first control qubits, and (ii) the target qubit, the ancilla qubit acting as a control qubit for the CNOT quantum logic gate;
   providing the ancilla qubit storing the logical-AND of the two first control qubits as a resource for one or more additional operations;
   uncomputing the logical-AND of the two first control qubits, comprising recovering the A-state of the ancilla qubit by replacing the state of the ancilla qubit storing the computed logical-AND of the two first control qubits with an A-state; and
   providing the ancilla qubit in the recovered A-state as a resource for one or more additional operations.

10. A method for performing a temporary logical AND operation on two control qubits, the method comprising:
    obtaining an ancilla qubit in an A-state;
    computing a logical-AND of the two control qubits and storing the computed logical-AND in the state of the ancilla qubit, comprising replacing the A-state of the ancilla qubit with the logical-AND of the two control qubits;
    maintaining the ancilla qubit storing the logical-AND of the two controls until a first condition is satisfied; and
    erasing the ancilla qubit when the first condition is satisfied.

11. The method of claim 10, wherein maintaining the ancilla qubit storing the logical-AND of the two controls until the first condition is satisfied comprises providing the ancilla qubit storing the logical-AND of the two control qubits as a resource for one or more additional operations.

12. The method of claim 11, wherein the one or more additional operations comprise operations that would otherwise be conditioned on the two control qubits.

13. The method of claim 11, wherein erasing the ancilla qubit when the first condition is satisfied comprises erasing the ancilla qubit when the one or more additional operations have been performed.

14. The method of claim 10, wherein erasing the ancilla qubit comprises transitioning the ancilla into a state that is independent of the state of the two control qubits and does not cause the two control qubits to decohere.

15. The method of claim 10, wherein erasing the ancilla qubit comprises applying a measure-and-correct process.

16. The method of claim 15, wherein the measure-and-correct process comprises:
   applying a Hadamard quantum logic gate to the ancilla qubit;
   measuring the ancilla qubit to generate a measurement result; and
   in response to determining that the generated measurement result indicates that the two control qubits are both ON, applying a CZ gate.

17. The method of claim 15, wherein the measure-and-correct process comprises Clifford operations.

18. The method of claim 10, further comprising correcting phase errors by applying an uncontrolled S gate to the ancilla qubit.

19. The method of claim 10, wherein computing the logical-AND of the two control qubits comprises applying three T gates, optionally approximately in parallel.

20. A quantum computing device comprising:
   a register of qubits comprising two control qubits, a target qubit, and an ancilla qubit prepared in an initial state;
   a plurality of control lines coupled to the register of qubits;
   a plurality of control circuits coupled to the plurality of control lines; and
   one or more computer-readable devices, including therein instructions that, when executed by one or more processors, cause the quantum computing device to perform operations that include:
   obtaining an ancilla qubit in an A-state;
   computing a logical-AND of the two control qubits and storing the computed logical-AND in the state of the ancilla qubit, comprising replacing the A-state of the ancilla qubit with the logical-AND of the two control qubits;
   maintaining the ancilla qubit storing the logical-AND of the two controls until a first condition is satisfied; and
   erasing the ancilla qubit when the first condition is satisfied.

* * * * *